United States Patent [19]

Hagenlocher et al.

[11] 4,288,711

[45] Sep. 8, 1981

[54] ALTERNATOR-RECTIFIER CONSTRUCTION WHERE SHEET METAL DIODE SUPPORT PLATES SUPPORT A BEARING

[75] Inventors: Walter Hagenlocher, Stuttgart; Heinz Hesse, Gerlingen; Karl Kleebaur, Allmersbach; Christoph Kugel, Stuttgart; Johann Künz, Sersheim; Werner Lemke, Bietigheim-Bissingen; Rüdiger Söhnle, Stuttgart, all of Fed. Rep. of Germany

[73] Assignee: Robert Bosch GmbH, Stuttgart, Fed. Rep. of Germany

[21] Appl. No.: 85,111

[22] Filed: Oct. 15, 1979

[30] Foreign Application Priority Data

Nov. 2, 1978 [DE] Fed. Rep. of Germany ....... 2847501

[51] Int. Cl.³ .............................................. H02K 11/00
[52] U.S. Cl. ..................................... 310/68 D; 310/89
[58] Field of Search ................. 310/68 R, 68 D, 89, 310/90; 357/81; 361/381–384, 417; 363/144, 145

[56] References Cited

U.S. PATENT DOCUMENTS

| 3,146,362 | 8/1964 | Bates et al. ................... 310/68 R |
| 3,271,601 | 9/1966 | Raver ............................ 310/68 R |
| 3,527,972 | 9/1970 | Franz et al. .................. 310/68 D |
| 3,553,505 | 1/1971 | Sato ............................... 310/68 D |
| 3,739,209 | 6/1973 | Drabik .......................... 310/68 D |
| 3,831,062 | 8/1974 | Haug et al. ................... 363/145 X |
| 4,197,473 | 4/1980 | Allport ......................... 310/68 D |

*Primary Examiner*—Mark O. Budd
*Attorney, Agent, or Firm*—Frishauf, Holtz, Goodman & Woodward

[57] ABSTRACT

To form a compact combination structure which provides efficient cooling and ease of assembly, maintenance and repair, while reducing the number of elements necessary to be stocked for maintenance or repair purposes, the rectifier portion of the alternator-rectifier combination comprises two groups of rectifiers which are, respectively, set in openings of two disk-shaped support plates 15, 35, which have, each, ring-shaped portions 38 surrounding the shaft and radially projecting fins 39, 39'. One of the plates is formed with a hub to retain one of the bearings, the outer portion of the fins is apertured for attachment to the shell of the alternator, and additionally deformed to provide seating surfaces for accurate positioning, for example by externally applied punch marks, of the plate. An insulating spacer 43, 43' separates the two plates which are so positioned that the fins of one plate are opposite the gap between fins of the other, so that air drawn axially by a ventilating fan will cool both plates.

27 Claims, 7 Drawing Figures

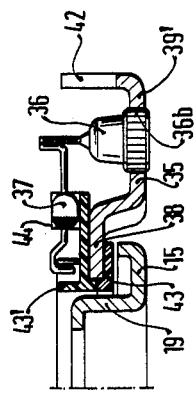
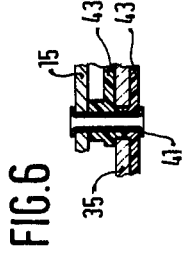
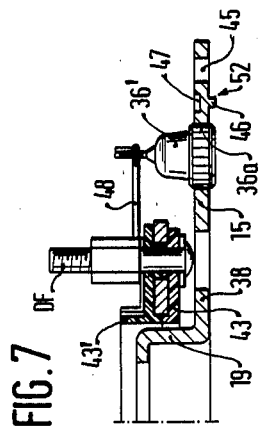
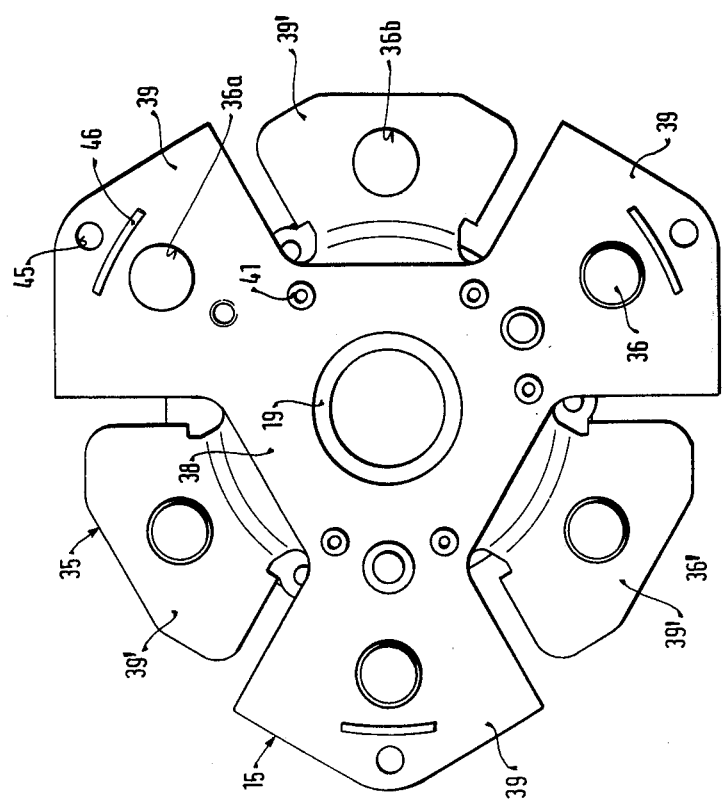

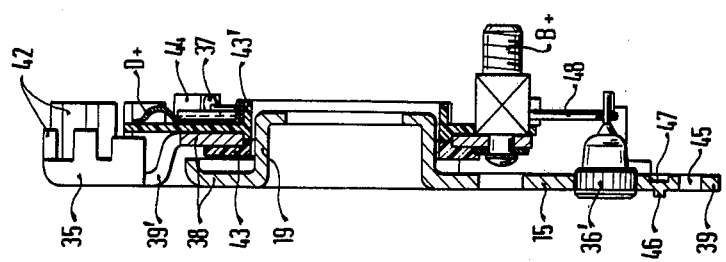

ALTERNATOR-RECTIFIER CONSTRUCTION WHERE SHEET METAL DIODE SUPPORT PLATES SUPPORT A BEARING

Reference to related applications, all assigned to the assignee of the present application:
U.S. Ser. No. 085,116, filed Oct. 15, 1979, HAGENLOCHER et al;
U.S. Ser. No. 085,115, filed Oct. 15, 1979, HAGENLOCHER et al;
U.S. Ser. No. 085,114, filed Oct. 15, 1979, FRISTER;
U.S. Ser. No. 085,113, filed Oct. 15, 1979, HAGENLOCHER et al;
U.S. Ser. No. 085,112, filed Oct. 15, 1979, HAGENLOCHER et al.

The present invention relates to an alternator-rectifier combination construction, and more particularly to such a construction suitable for automotive vehicles, and especially to a construction in which rectifier diodes are press-fitted or otherwise secured within openings formed in structural components of the alternator itself.

BACKGROUND AND PRIOR ART

Various types of automotive alternators are known. It has been found particularly advantageous to use interdigeted pole or claw-pole type alternators with the armature windings on the stator, and a rotating field. The a-c output of the alternators is rectified, preferably in diode-type bridge rectifiers, of which one rectifier is provided to supply the load, and another rectifier assembly may be used, separately, to supply field current. Reference is made to U.S. Pat. No. 3,320,498 which shows a rectifier assembly secured to individual heat sink plates which are positioned in crossed relation to each other and spaced from each other by spacing elements. U.S. Pat. No. 3,739,210 shows a rectifier assembly for connection to generators which are shaped in partial ring form and which have conductive plates which form cooling or heat dissipating plates secured on an insulating plate.

A stacked, interlaced or sandwich-type rectifier assembly is described in U.S. Pat. No. 3,831,062, to which German Patent DE-PS 22 50 557 corresponds, in which the heat dissipating or heat sink plate is an essentially circular element having finger-like projections. The fingers of the respective cooling elements interdigit in such a manner that the finger of one cooling element fits in the gap between two fingers of another cooling element. U.S. Pat. No. 4,059,778-Sohnle, to which German Disclosure Document DE-OS 26 03 786 corresponds, discloses a crossed arrangement of cooling or heat dissipating sheet metal elements which are flat and are suitable for association with or assembly with three-phase alternators. It is customary construction to insert rectifier diodes into one of the end bells or end covers of an alternator.

The various known constructions have to be built to fit specific arrangements, and they can meet only very specific requirements. If the rectifier diodes are inserted into an end bell of an alternator, the alternator can be adequately cooled and the rectifiers can be well cooled; it is difficult, however, to test the alternator, the rectifier diodes and, in case of defects, to replace the end bell and the diodes, since they have to be disconnected and new ones reconnected. Repair thus is a problem; further, the construction is specific to particular alternators and thus stocking of parts for different kinds of alternators, both for manufacture as well as for repair purposes causes problems. If the support for the rectifier diodes is a flat plate, the diodes themselves are frequently not sufficiently cooled. Forming a cooling assembly with crossed dissipating or heat sink plates and fingers requires substantial space which frequently is not available in the alternator-rectifier combination, which should be as compact as possible. Constructing the cooling plates as segmental elements, similar to a quarter-moon, has been found to provide inadequate cooling and the construction is subject to fissures and breaks. It is difficult to insulate such structures within an alternator to prevent the formation of sneak or stray currents.

Some arrangements use two cooling plates or cooling or heat dissipating elements; thus, only one group of diodes is secured to the end bell of the alternator, the other to the additional heat dissipating plate. Such additional plates have been usually assembled to the end bell as additional, separate elements which require separate assembly steps both in manufacture, and disassembly and re-assembly upon repair. Since automotive alternator structures are subject to extremes of vibration and shock, the respective elements have to be reliably secured together which requires care and hence expense in manufacture as well as upon repair or maintenance.

THE INVENTION

It is an object to construct an alternator-rectifier combination, particularly suitable for automotive application, which is simple to assemble and repair, in which the requirements for stocking of repair parts are low, and such stocking can be used to supply alternator-rectifier combinations of various types and for various models of vehicles, while providing efficient cooling for the diodes.

Briefly, two groups of rectifier diodes are connected to the armature windings and mechanically seated in disk-shaped support plates in which, each, one group of rectifiers is secured. The support plates form heat sinks and heat dissipation elements for the diodes. They are located adjacent the one axial end of the shaft. Each support plate has an essentially ring-shaped central portion surrounding the shaft, and radially projecting fins which define gaps therebetween. The ends of one plate are positioned opposite the gaps of the other plate, so that cooling air can pass against and around the respective fins. One of the plates, at least, is secured to the frame or shell of the alternator and further formed with a hub portion or bearing bushing to also retain the bearing for the shaft. The plates, adjacent the fins, have enlarged openings in which the diodes are secured, for example by a press fit. The plates themselves are spaced from each other by an electrical insulating spacer which, further, can be shaped to secure and retain connecting rails for the diodes. The spacers can additionally form support clips for further diodes, such as exciter diodes for the field of the alternator.

The alternator has the advantage that the full cross-sectional area of the generator is utilized for cooling of the rectifier diodes. The axial length of the rectifier assembly is short, so that the overall axial length of the alternator-rectifier combination is short. The manufacturer of the alternator-rectifier combination is not restricted to utilize a predetermined diode structure but, rather, diodes of various types may be used. The rectifier is completely pre-assembled as a subassembly before assembly of the rectifier-subassembly with the remaining generator, and thus can be tested before it is assembled to the generator for accuracy of centering of the bearing secured therein, as well as for other tolerances; additionally, complete electrical testing can be carried out on the rectifier subassembly before connection to the wire terminals from the armature of the windings of the alternator.

In accordance with a feature of the invention, the axial extend of the rectifier assembly is defined only by the height of the diodes which, therefore, can be held to be low. Additional diode elements for the field can be placed suitably connected within the vertical outline of the main power rectifier diodes. The stability of the rectifier assembly which, simultaneously, forms the bearing support for the alternator shaft is readily obtained by bending over the edges of the fins forming the rectifier support plates to form beads projecting, for example, at 90° from the major plane of the plates on which the diodes are supported. Stability of the plates, and particularly of one of them, is important since that one will then also be used to support the bearing. The bent-over edges, forming beads, themselves can be serrated or crenelated to have projecting fingers, which further increases the cooling effect. The plate can be made of sheet metal so that inexpensive raw material can be used and the manufacturing processes themselves to shape the plates can be standard sheet metal working processes, such as deep-drawing, extrusion pressing or extrusion molding.

DRAWINGS

Illustrating a preferred example, wherein:

FIG. 2 is a top view of the rectifier array looked at from the side of the bearing;

FIG. 3 is a cross section through the rectifier array and its associated cooling plates;

FIG. 4 is a view similar to FIG. 2, and illustrating the complete assembly; and

FIGS. 5, 6 and 7 are fragmentary sectional views taken along lines V—V, VI—VI and VII—VII of FIG. 4.

Figure 1:
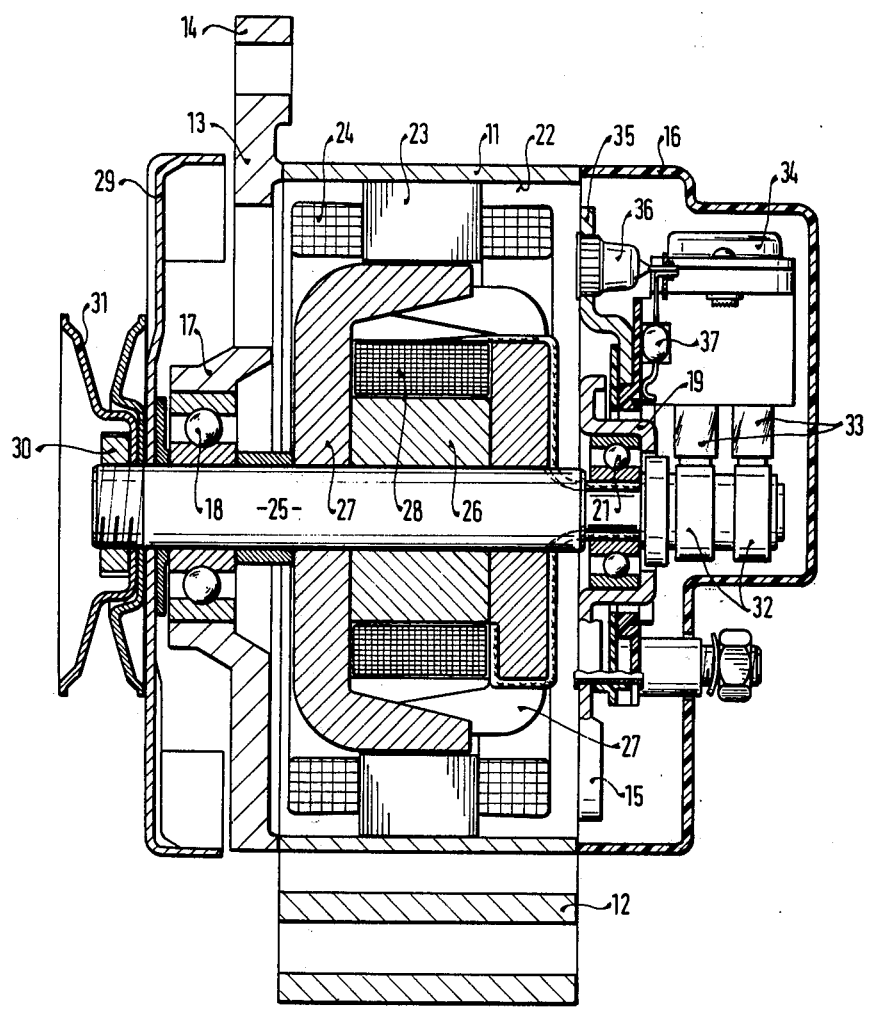
FIG. 1 is a highly schematic axial sectional view through an alternator-rectifier combination, in which all parts not necessary for an understanding of the invention have been omitted.

General construction with reference to FIG. 1: An automotive alternator has a housing shell or frame 11, on which a holding bracket 12 is secured. At the drive side of the alternator, an end cover 13 with a holding bracket extension 14 is secured. The other axial end of the alternator is closed off by an end cover plate 15 which holds a bearing 21. A protective cover 16, for example of plastic, is attached at the axial end holding the bearing 21, and closes off the right-hand side (FIG. 1) of the alternator. The drive side of the alternator has a hub 17 attached to the end cover 13, in which a bearing 18 is seated.

The end cover 15 forms, simultaneously, a cooling plate for rectifier diode 36 and a holding element for the bearing 21, which is a fitted into a hub bushing 19. An armature core stack 23 is secured within the frame 11, the stack having armature windings 24 wound thereon. The rotor of the alternator comprises a rotor shaft 25, journalled in the bearings 18, 21, a core 26, field winding 28, and interdigited or claw-poles 27. A fan or ventilating blade 29 and a drive pulley 31 are secured to the shaft 25 at the drive end of the alternator with a nut 30. The wire ends of the field winding 28 are connected to slip rings 32, secured on the shaft 25. The slip rings 32 are in engagement with brushes retained in a brush holder 33, on which a voltage regulator 34 is mounted, and electrically connected. The rectifier which is connected to the armature winding 24 includes, besides the cover 15 and the rectifier diode 36, a further cooling plate 35. Additional rectifier diodes 37 are provided to supply rectified power to the field coil 28. The electrical connection of the voltage regulator and the field winding as well as of the alternator itself can be in accordance with any well known and standard connection.

The end cover 15 which, simultaneously, is a cooling element for the rectifier diodes, as well as the holder for the bearing 21, is best seen in FIG. 2. As illustrated in FIG. 2, the bearing 21 has been removed from the bearing holding bushing 19. The cooling and end plate 15 has an essentially ring-shaped portion 38 and radially externally projecting fins 39.

A second plate 35 has a ring-shaped portion and radially projecting fins 39'. The radially projecting fins 39, 39' are so arranged relative to each other that the fins 39 are positioned within the gaps between adjacent fins 39', and vice versa. The fins 39, 39' are slightly narrower than the dimension resulting from a mathematically uniform division in order to provide gaps between the superposed fins, as is clearly apparent in FIG. 2, and to permit ready flow of air against as well as past the fins. The two cooling fins 15, 35 are secured together by rivets 41 (FIG. 6). The cooling plate 15 has diodes 36' press-fitted in openings 36a (FIGS. 2, 5, 7); diodes 36 are press-fitted in the cooling plate 35 in openings 36b, the diodes 36, 36' being located in the regions of the fins 39', 39.

FIG. 3 illustrates the axial arrangement of cooling plate 15, the bearing bushing 19 and the attachment of one of the power rectifier diodes 36', as well as the relationship of the element 15 with respect to the other cooling plate 35. The edges of the projecting fins 39' of the cooling plate 35, as well as the edges of the fins 39 and the cooling plate 15 are bent over, that is, are formed with bent-over beads 42, which are slotted at the end portion to have terminal slotted fingers (FIG. 3). These bent-over edges 42 increase the effective cooling area and further contribute to the stability of the cooling plate which, preferably, is made of sheet metal. An electrically insulating spacer and carrier 43 is secured between the cooling plate 35 and the cooling plate 15, held in position by the rivets 41. The spacer 43 is extended by an extension element 43', likewise of insulating material, which is also positioned between the cooling elements 15 and 35 and engages over and around the cooling plate 35. It, also, is maintained in position by the rivets 41 (see FIG. 6). The carrier 43' has a pressure contact D+ secured thereto, which is utilized to form an electrical connection to the voltage regulator 34. The field or exciter rectifier diodes 37 are secured to the support 43' (FIGS. 3, 5). They are held in position by extensions 44 of the carrier 43.

A main power supply connecting bolt B+ is riveted to the plate 35, which forms the output terminal of the rectifier, connected to the alternator, and thus the d-c output of the alternator-rectifier combination. The negative or chassis terminal of the rectifier is formed by the plate 15 which, likewise, retains the bushing for the bearing 21 and, hence, is connected to chassis or ground through the metallic structure of the alternator. A separate B— connection can be provided, if desired.

The plate 15, which likewise secures the bearing 21, is attached to the frame or housing 11 of the alternator. To permit attachment to the alternator housing, the fins 39 are formed with openings 45 (FIG. 2). The plate 15 is centered with respect to the alternator frame or housing 11 by projecting ridges 46 which project inwardly towards the housing 11 (see FIG. 3) and which are formed by punch depressions 47 punched into the sheet metal plate 15.

Referring now to FIG. 4, which shows the details of the construction. Electrical connecting leads 48 connect the electrode terminals of diodes 36, 36', forming wire bridges between the diodes. The electrical leads 48 are connected to terminal ends of the armature winding 24, that is, to the three-phase terminals. In accordance with a feature of the invention, the connection between leads 48 and the phase terminals from the armature is made on holders 49 secured to the carrier or spacer elements 43'. The holders 49 are best seen at the bottom portion of FIG. 4, and provide snap-in extensions which simultaneously clamp the connecting leads or wires 48 and provide space for a plug-in connection of a terminal connector, connected to the end leads of the armature windings of the armature 24; any suitable standard terminal connector may be used.

The diodes 36, 36' are set into respective openings 36a, 36b (FIG. 2) formed, respectively, in the plates 15, 35. The connection is, preferably, by a press or interference fit (see FIGS. 5 and 7) in accordance with well known diode connection technology.

FIGS. 5 to 7 are fragmentary sectional views which show the details of the connection of the rectifier elements. FIG. 5 is a section through a fin 39', in which a diode 36 is inserted, and showing, also, the bearing bushing 19 formed in the plate 15; FIG. 5 also shows the arrangement of one of the field rectifier diodes 37 held in a holder clip extension 44 formed on the insulating element 43'—see also FIG. 4 showing the field rectifier diodes 37 in the holders 44. FIG. 6 is a fragmentary section illustrating the rivet connection by means of the rivet 41, and illustrating the insulation between the plates 35 and 15 by the spacer 43 and the spacer element 43'. FIG. 7 illustrates the connection of the terminal DF, forming an external terminal for connection, for example, to a charge indicator such as a charge indicator lamp, when the alternator is associated with the electrical system of a motor vehicle. FIG. 7 also shows clearly the projection 46, which has an outer surface 52, fitting into the inner surface 22 of the housing shell 11, after assembly of the plate 15 to the alternator.

The plates 15, 35, and specifically the plate 15, preferably are made of sheet metal. Such plates are stiff in a direction transverse to the plane of the plate itself, that is, transverse to a longitudinal axis of symmetry, but elastic in the plane of the plate, that is, in the direction of the generator shaft 25. The elasticity, by which the plates 15, 35 act somewhat like a membrane, permits compensation for longitudinal movement of the generator shaft 25, and elastic acceptance of changes in length. Such longitudinal movements arise, for example, by differential expansion of the shaft and of the remainder of the generator, and specifically the generator shell or housing. The shell 11, preferably, is made of aluminum and thus will have a different axial expansion than the generator shaft 25 which, preferably, is made of steel upon temperature rise of the alternator in operation.

The fin extensions 39' of the element 35 are preferably axially offset or bent into the plane of the plate 15. This offset then places the diodes 36, 36' of the groups of diodes at the same level. This results in a compact diode assembly, permitting construction of the entire diode assembly,—dissipating plates and fins with minimum axial extent. The axial space taken by the assembly is practically determined only by the height of the diodes 36, 36'.

The support plates 15, 35 are, preferably, of essentially similar plan outline, with the outer corners of the fins 39' being somewhat chamfered or relieved with respect to the corners of the fins 39 (see FIG. 2). The support plates have radial axes of symmetry which are essentially similar so that, before each plate 35 is axially deformed to place the fins 39' at the same level as the fins 39, the support plates can be made of roughly similar plan outline.

Various changes and modifications may be made within the scope of the invention concept.

We claim:

1. Mobile alternator-rectifier combination construction, particularly for automotive vehicles, having
   a frame structure (11);
   a stator (23, 24) secured to the frame structure and having an armature winding (24);
   a rotor (26, 27, 28) having a rotor shaft (25);
   two bearings (18, 21) journaling the rotor;
   an end cover (13) secured to one end of the frame and retaining one (18) of the two bearings, and extending transversely to the axis of rotation of the shaft;
   and two groups of rectifier diodes (36, 36') electrically connected to the armature winding,
   and comprising, in accordance with the invention,
   two membrane-like disk-shaped sheet metal support plates (15, 35) positioned adjacent the axial end of the shaft remote from said end cover (13);
   each support plate including
   an essentially ring-shaped portion (38) surrounding the shaft and radially projecting fins (39, 39') defining gaps therebetween;
   at least one (15) of the disk-shaped support plates being secured to the frame and the other (21) of said two bearings (18, 21) being secured to the ring-shaped portion (38) of said at least one (15) of the support plates (15, 35);
   one group of rectifier diodes (36, 36'), each, being secured to a respective support plate
   whereby at least one support plate forms the support for the other bearing (21) and a heat sink and heat dissipation element for the diodes thereon;
   electrically insulating means (43, 43') interposed between said support plates;
   and wherein the diodes (36, 36') of the groups of rectifier diodes are secured on the projecting fins (39, 39') of the disk-shaped sheet metal support plates (15, 35).

2. Construction according to claim 1, wherein the fins (39, 39') are formed with openings (36a, 36b) therein matching the outline of the diodes; and the diodes are secured in said openings.

3. Construction according to claim 2, wherein the diodes (36, 36') are press-fitted in the openings of the respective fins (39, 39').

4. Construction according to claim 1, wherein the electrical insulating means (43, 43') interposed between the support plates comprises an electrically insulating spacer element and includes a carrier portion (43');
   and a further rectifier (37) being supported on and secured to said carrier portion.

5. Construction according to claim 4, wherein said further rectifier (37) is connected to the field of the alternator secured to the rotor to supply excitation current to the alternator field.

6. Construction according to claim 1, wherein the edges (42) of said projecting fins (39, 39') are bent over from the major plane of the respective support plates to form stiffening beads.

7. Construction according to claim 6, wherein the bent-over edges have approximately the same height as the minimum projecting height of the rectifier diodes from the respective support plate.

8. Construction according to claim 6, wherein the bent-over edges have toothed or crenelated or serrated portions at their terminal ends to form bent-over fingers.

9. Construction according to claim 1, wherein the projecting fins of one of the support plates are axially offset with respect to the associated ring-shaped portion by a distance approximately that of the interposed electrical insulating means (43, 43') so that the respectively bent fins lie in approximately the same plane as the fins of the other plate.

10. Construction according to claim 1, wherein said electrical insulating means (43, 43') comprises a spacer element and includes electrical terminal holding means (49);

and electrical connecting elements (48) interconnecting the rectifier diodes of the groups of diodes (36, 36') and secured by said holding means.

11. Construction according to claim 10, wherein said holding means are formed to provide electrical terminal connection holders for the terminals of the armature winding (24).

12. Construction according to claim 9, wherein, before axial deformation of one of the support plates, said support plates are of essentially similar plan outline.

13. Construction according to claim 1, wherein the support plates have radial axes of symmetry which are essentially similar.

14. Construction according to claim 1, wherein said one disk-shaped support plate (15) carrying said other bearing is formed with a central bearing bushing (19) at its ring-shaped portion (38) to retain said other bearing therein.

15. Construction according to claim 1, wherein at least one of said support plates (15, 35) has portions (42; 19) deformed from the major plane of the sheet metal which forms the support plate, and in which at least one of the deformations comprises a deep-drawn deformation.

16. Construction according to claim 1, wherein at least one of said support plates (15, 35) has portions (42; 19) deformed from the major plane of the sheet metal which forms the support plate, and in which at least one of the deformations comprises an extruded deformation.

17. Construction according to claim 1, wherein at least one of said support plates (15, 35) has portions (42; 19) deformed from the major plane of the sheet metal which forms the support plate, and in which at least one of the deformations comprises an extrusion-molded deformation.

18. Construction according to claim 1, wherein said one support plate (15) secured to the frame (11) is formed with openings (45) in the projecting fins (39) for attachment to the frame (11).

19. Construction according to claim 1, wherein said one support plate (15) secured to the frame (11) is formed with projecting means (46) at the side thereof facing the frame;

said frame comprises a tubular shell (11);

and the projecting means (46) have radially outwardly directed surfaces (52) fitting against the inner surfaces (22) of said shell (11) to position and center the said one plate with respect to the shell.

20. Construction according to claim 19, wherein the projecting means (46) comprise inwardly extending punch deformations (47) formed from the other side of the respective support plate.

21. Construction according to claim 1, wherein said one support plate (15) having the other bearing (21) secured thereto is resilient in axial direction—with respect to the shaft (25)—and stiff in a direction transverse to said shaft to permit axial excursion of the shaft with respect to the housing upon differential heat expansion of the frame structure and the rotor.

22. Construction according to claim 1, further including an outer cover cap (16) protecting the rectifier.

23. Construction according to claim 22, further including a voltage regulator (34) secured to the alternator, said voltage regulator being positioned within the cover cap (16).

24. Construction according to claim 1, wherein the electrical insulating means (43, 43') comprises a spacer element;

further includes a projecting extension (44) to form a support element projecting axially from the spacer element;

and separate field excitation diodes (37), said field excitation diodes being secured to and supported by said projecting extensions, and electrically connectable to the rotor.

25. Construction according to claim 24, further including an insulated terminal element (DF) secured to the carrier portion of the spacer element for connection of a charge control lamp.

26. Construction according to claim 25, further including a pressure contact (D+) secured to the carrier portion of the spacer element and forming a resilient pressure connection for a voltage regulator.

27. Construction according to claim 1, wherein the support plates are essentially similar plan outline.

* * * * *